United States Patent [19]

Le Méhauté et al.

[11] Patent Number: 5,007,016

[45] Date of Patent: Apr. 9, 1991

[54] FRACTAL-TYPE PERIODIC TEMPORAL SIGNAL GENERATOR

[75] Inventors: Alain Le Méhauté, Gif sur Yvette; Claude Roques-Carmes, Besancon; Dalloul Wehbi, Besancon; Jean-Francois Quiniou, Besancon, all of France

[73] Assignee: Compagnie Generale D'Electricite, Paris, France

[21] Appl. No.: 287,429

[22] Filed: Dec. 21, 1988

[30] Foreign Application Priority Data

Dec. 21, 1987 [FR] France ............................. 87 17809

[51] Int. Cl.$^5$ ........................... G06F 1/02; G06F 1/04; G06F 7/58; G06F 9/302

[52] U.S. Cl. ............................... 364/900; 364/923.5; 364/926; 364/927.92; 364/927.97; 364/931; 364/931.1; 364/933; 364/937.1; 364/937.2; 364/950; 364/950.1; 364/962.1; 364/963; 364/717; 364/487; 380/46; 341/117

[58] Field of Search ............................... 358/131-136, 358/36, 44; 364/487, 200 MS File, 900 MS File, 717; 341/86, 117, 178, 179; 380/46

[56] References Cited

U.S. PATENT DOCUMENTS

| | | | |
|---|---|---|---|
| 3,963,905 | 6/1976 | Gopinath et al. | 364/717 |
| 4,251,831 | 2/1981 | Kamath | 358/21 R |
| 4,559,602 | 12/1985 | Bates, Jr. | 364/487 |
| 4,694,407 | 9/1987 | Ogden | 364/518 |
| 4,719,642 | 1/1988 | Lucas | 375/30 |
| 4,720,871 | 1/1988 | Chambers | 382/42 |
| 4,775,946 | 10/1988 | Anjyo | 364/521 |
| 4,799,165 | 1/1989 | Hollister et al. | 364/487 |
| 4,819,818 | 4/1989 | Simkus et al. | 364/717 |
| 4,852,023 | 7/1989 | Lee et al. | 364/717 |
| 4,873,647 | 10/1989 | Banki et al. | 364/200 |
| 4,901,264 | 2/1990 | Hayashi | 364/717 |

FOREIGN PATENT DOCUMENTS 2176678 12/1986 United Kingdom .

Primary Examiner—Terrell W. Fears
Assistant Examiner—George C. Pappas
Attorney, Agent, or Firm—Sughrue, Mion, Zinn, Macpeak & Seas

[57] ABSTRACT

A signal generator generates a temporal signal with a periodic configuration defined by an arrangement of seed patterns resulting from a branching construction iteratively using laws for composing several patterns and consisting in defining the periodic configuration of the signal as a component "$a_n$" of the nth term Un with several components ($a_n$, $b_n$) of a recurrent sequence defined at the level of each of its components by a specific recurrent composition law, the initial term U0 having for its components the seed patterns ($a_0$, $b_0$). The temporal signals known as "fractal" signals result from a branching construction of this kind. The generator comprises a microprocessor (10) associated with a keyboard-display system (11), a read-only memory (12) for programs, a random access memory (13) and an output digital-to-analog converter (14). When creating a signal periodic configuration pattern its working memory contains at least three files: a current patterns file, a previous patterns file and an old patterns file, the current patterns being constructed from arrangements of old patterns in which the seed patterns have been replaced by the preceding patterns.

4 Claims, 3 Drawing Sheets

FRACTAL-TYPE PERIODIC TEMPORAL SIGNAL GENERATOR

BACKGROUND OF THE INVENTION

The present invention concerns periodic temporal signals the configuration of which over a time period is defined by an arrangement of seed patterns of different types resulting from a recursive construction using successively applied recurrent pattern element composition laws generating on each new iteration progressively more complex patterns. Generally speaking, the configuration over a time period of a temporal signal resulting from this kind of branching construction may be considered as a component "$a_n$" of the Nth term Un with m components ($a_n$, $b_n$, $c_n$, etc) of a recurrent sequence, this nth term being defined at the level of each of its components ($a_n$, $b_n$, $c_n$, etc) according to the components ($a_{(n-1)}$, $b_{(n-1)}$, $c_{(n-1)}$, etc) of the preceding term $U_{n-1}$ by the arrangements of the recurrent pattern type composition laws and the initial term Uo of the sequence having for its components ($a_0$, $b_0$, $c_0$, etc) the seed patterns.

The branching construction process makes it possible to increase the complexity of the pattern obtained from one iteration to another extremely quickly. It produces after very few iterations a signal pattern having the general appearance of noise although it is in fact highly structured and has complex self-simulating properties resulting from the iteration process. Because of these characteristics the resultant temporal signal finds beneficial applications in varied techniques including vibration testing, transducers and stimulators, deposition of electrochemical layers using pulsed current, chemical synthesis of disordered systems, optical modulation, etc.

Signals known by the general name fractal temporal signals result from branching constructions of this kind.

An object of the present invention is a periodic temporal signal generator making it possible to generate very quickly a great diversity of periodic signals having a period with a recursive structure of the aforementioned type.

SUMMARY OF THE INVENTION

The periodic temporal signal generator in accordance with the present invention comprises a microprocessor associated with a keyboard-display system for entering seed patterns ($a_0$, $b_0$, etc) and recurrent pattern type composition laws, with a working memory storing a definitive patterns file which contains an arrangement of seed patterns constituting a signal configuration over a given iteration period and which is read repetitively, and with an output peripheral device producing a periodic output signal with instantaneous values agreeing with those read from the definitive patterns file. Its working memory stores at least three files during creation of the periodic configuration pattern: a current patterns file receiving the patterns resulting from the current iteration step, a previous patterns file containing the patterns resulting from the last iteration step before the current one, and an old patterns file containing the patterns resulting from an iteration step preceding the previous two, the patterns resulting from the current iteration step being constructed from arrangements of seed patterns constituting the old patterns in which the seed patterns have been replaced by the previous patterns of the same type.

The old patterns file advantageously contains the basic patterns resulting from the first application to the seed patterns of the recurrent composition laws.

BRIEF DESCRIPTION OF THE DRAWINGS

Other characteristics and advantages of the invention will emerge from the description of one embodiment given by way of example. This description will be given with reference to the drawings in which.

DETAILED DESCRIPTION OF THE PREFERRED EMBODIMENT

Figure 1:
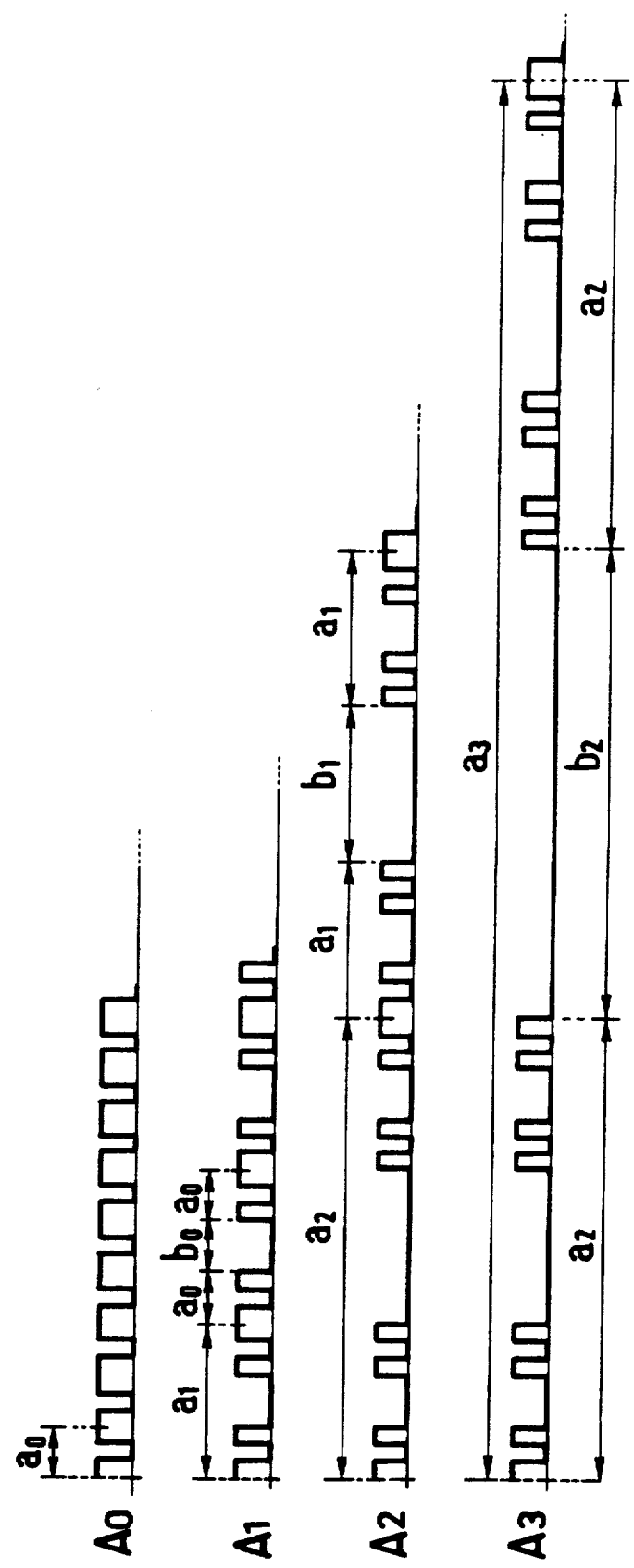
FIG. 1, is a timing diagram showing by means of signal examples the extremely rapid increase in the complexity of the pattern over a period obtained by the branching construction process.

FIG. 1 gives an example of the definition of a temporal binary signal by means of a sequence "$a_n$" of values which represent regular sampling of one of the periods of the signal and which is obtained by a branching construction utilizing two seed patterns:

$$a_0 = 1\ 0\ 1$$

$$b_0 = 0\ 0\ 0$$

associated with two recurrent pattern type composition laws:

$$a_n = a_{n-1}\, b_{n-1}\, a_{n-1}$$

$$b_n = b_{n-1}\, b_{n-1}\, b_{n-1}$$

Each ith step of the construction leading to the definition of the pattern "$a_i$" necessitates a knowledge of the pair of patterns $a_{(i-1)}$ $b_{(i-1)}$ obtained in the previous step which may be regarded as the components of a term $U_{(i-1)}$ of a recurrent sequence having an initial term U0 made up of the seed patterns $a_0$, $b_0$.

In the present case the two composition laws adopted make it possible to define the period of the binary signal obtained by recursion from the elementary pattern 101 in the manner in which CANTOR obtains his geometrical or diadic cut-outs (cf B. Mandelbrot "The Geometry of the Nature", Freedmann—1982) and so to obtain a fractal signal.

The curve A0 represents by way of example the temporal signal having for its periodic configuration the seed pattern $a_0$. It is a regular periodic squarewave signal made up of pulses with a mark-space ratio of 2:1.

The curve A1 shows by way of example the temporal signal having for its periodic configuration the pattern $a_1$ deduced from the seed patterns $a_0$, $b_o$ after one application of the recurrent pattern type composition laws:

$$a_1 = a_0\, b_0\, a_0$$

$$a_1 = 101000101$$

This signal is a slightly irregular squarewave signal with unitary width and double width pulses and a period three times longer than the previous signal.

The curve A2 shows the temporal signal having for its periodic configuration the pattern A2 deduced from the seed patterns $a_0$, $b_0$ by applying the recurrent composition laws twice:

$$a_2 = a_1 \, b_1 \, a_1$$

$$a_2 = a_0 \, b_0 \, a_0 \, b_0 \, b_0 \, b_0 \, a_0 \, b_0 \, a_0$$

$$a_2 = 101000101000000000101000101$$

This is a binary signal clearly more irregular than the previous signal with pulses for the most part of unitary width and a period three times longer than that of the previous signal.

The curve A3 represents the temporal signal having for its periodic configuration the pattern $a_3$ deduced from the seed patterns $a_0$, $b_0$ by applying the recurrent pattern type composition laws three times:

$$a_3 = a_2 \, b_2 \, a_2$$
$$a_3 = a_1 \, b_1 \, a_1 \, b_1 \, b_1 \, b_1 \, a_1 \, b_1 \, a_1$$
$$a_3 = a_0 \, b_0 \, a_0 \, b_0 \, b_0 \, b_0 \, a_0 \, b_0 \, a_0 \, b_0 \, b_0 \, b_0 \, b_0 \, b_0$$
$$b_0 \, b_0 \, b_0 \, b_0 \, a_0 \, b_0 \, a_0 \, b_0 \, b_0 \, b_0 \, a_0 \, b_0 \, a_0$$

This is a binary signal that is even more irregular than the previous one and has a period three times as long as that of the previous signal.

Each time the recurrent pattern type composition laws are applied the number of pattern elements is increased by three. This growth law reaches very high values quickly. On the thirteenth application of the recurrent laws the value is already:

$$3^{14} = 4\,782\,969$$

which for a temporal signal defined by sequential pulses (0, 1) at the rate of one per second corresponds to a duration in excess of one thousand hours (one month). A signal of this kind looks like noise although it is very highly structured and formed of pulses having a Cantorian organization giving it self-simulating properties irrespective of the scale of temporal analysis and which make it particularly useful in various techniques including the manufacture of Cantorian macromolecules by electrosynthesis, vibration testing in mechanical engineering for predicting or determining the long-term behavior of certain materials (friction surfaces, for example), the excitation of transducers and stimulators and all techniques conventionally utilizing spectral considerations. It goes without saying that the two seed patterns can be changed at will.

Figure 2:
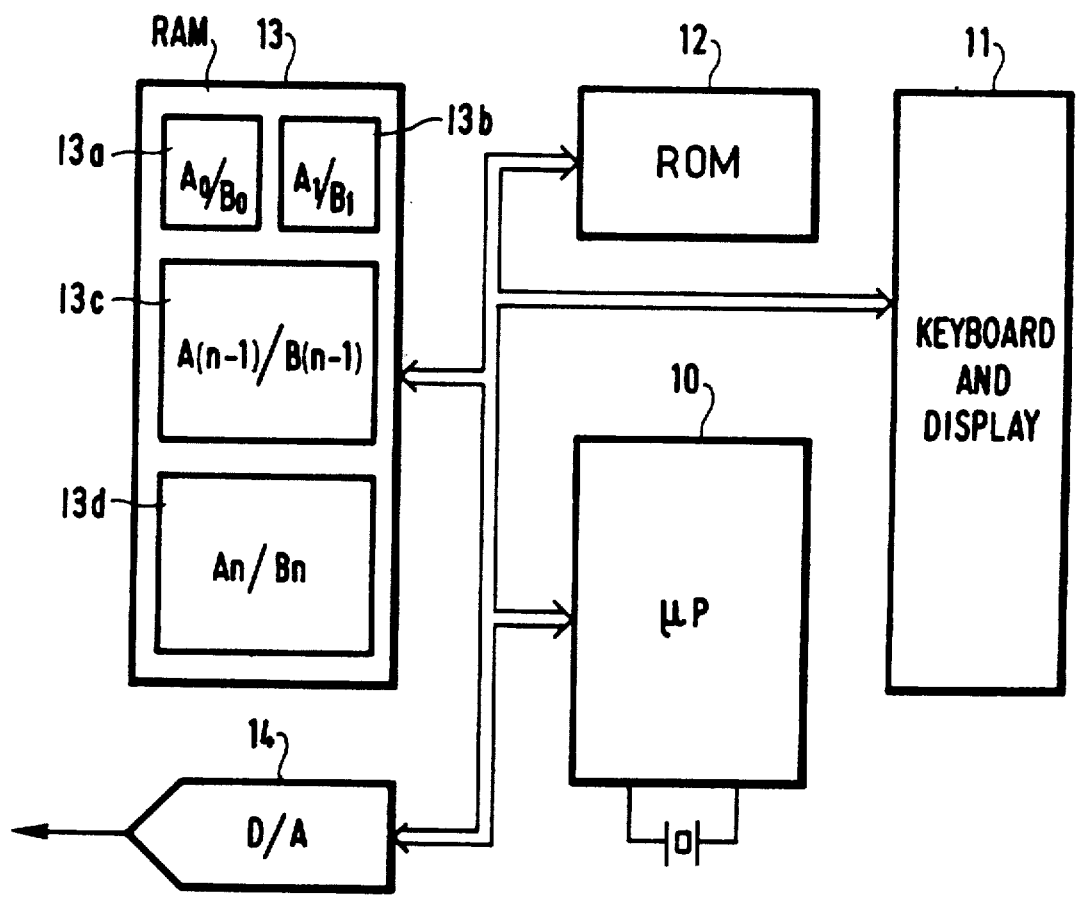
FIG. 2 shows a block schematic of a signal generator in accordance with the invention enabling implementation of the branching construction process.

FIG. 2 shows a periodic temporal signal generator using the previously described branching construction to define the signal over one period. This generator essentially comprises a microprocessor 10 associated with a keyboard-display system 11, a program read-only memory 12, a working random access memory 13 and an output digital-to-analog converter 14.

Under the control of programs stored in the read-only memory 12 and instructions from an operator input through the keyboard-display system 11, the microprocessor 10 determines a pattern for the periodic configuration of a signal and produces the signal according to the pattern created.

The operations carried out by the microporcessor 10 will now be described with reference to the flowchart of FIG. 3.

Figure 3:
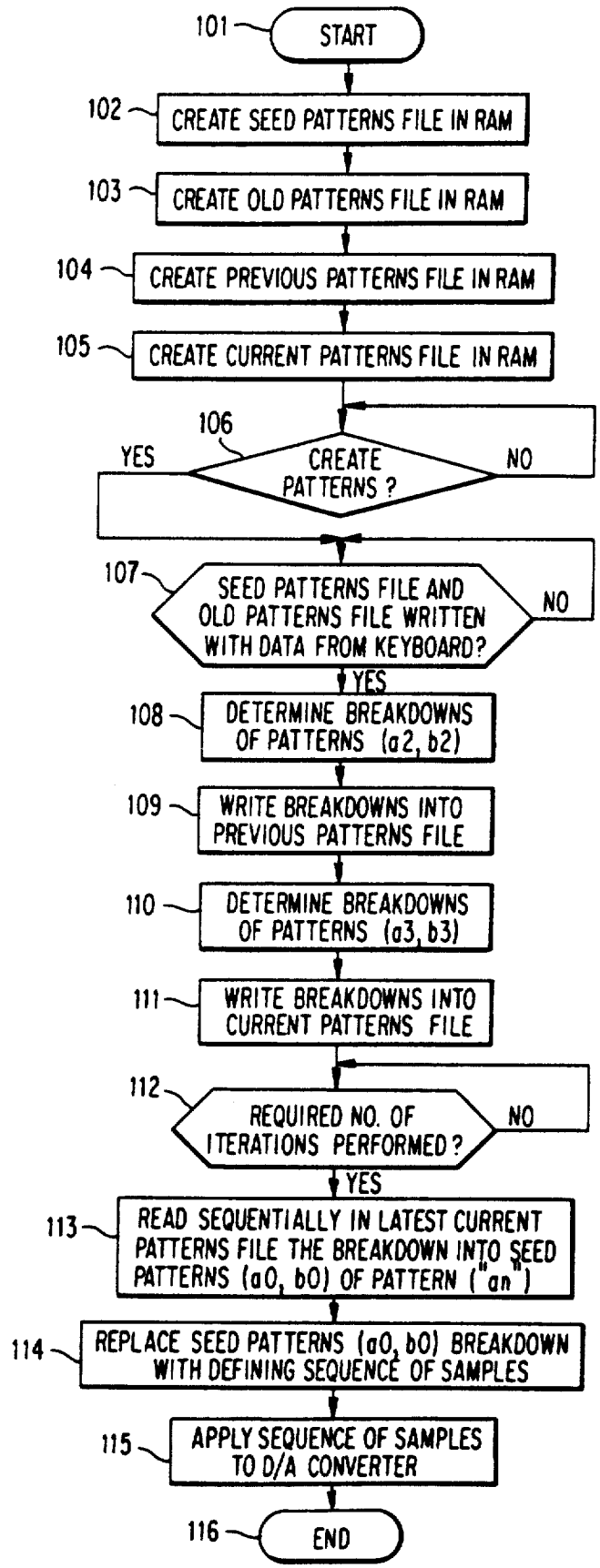
FIG. 3 shows a flowchart showing operations carried out by a microprocessor in accordance with the invention.

When determining a periodic configuration pattern in response to an instruction received from the keyboard-display system 11 and specifying the composition of the seed patterns $a_0$, $b_0$, the recurrent composition pattern type laws defined by breaking down into seed patterns $a_0$, $b_0$ the patterns $a_1$, $b_1$ resulting from the first application of these laws and the number of iterations, the microprocessor 10 creates in the working random access memory 13:

a so-called seed patterns file 13a for storing the values of samples constituting the seed patterns (see program step at block 102 on flow chart shown on FIG. 3);

a so-called old patterns file 13b for storing the breakdowns of the patterns $a_1$, $b_1$ into seed patterns $a_0$, $b_0$ which define the recurrent pattern type composition laws (block 103), a so-called previous patterns file 13c for storing the breakdowns into seed patterns $a_0$, $b_0$ of the latest patterns obtained $a_{(n-1)}$, $b_{(n-1)}$ (block 104), and a so-called current patterns file 13d into which it writes as they are produced the breakdowns into seed patterns $a_0$, $b_0$ of the patterns an, bn currently being determined (block 105).

On receiving the instruction to create a pattern (block 106), and when the seed patterns file and the old patterns file have been written with the data from the keyboard (block 107), micropocessor 10 begins the branching construction with a first iteration during which it determines the breakdowns into seed patterns $a_0$, $b_0$ of the patterns $a_2$, $b_2$ (block 108) and writes them as they are determined into the previous patterns file (block 109) serving temporarily as a current patterns file. It then undertakes a second iteration during which it determines the breakdowns of the patterns $a_3$, $b_3$ (block 110) and stores them in the current patterns file (block 111) and then continues the branching construction with other iterations at the beginning of which the roles of the previous and current patterns files are interchanged, until the required number of iterations has been performed (block 112).

On each iteration the microprocessor 10 determines the breakdowns into seed patterns $a_0$, $b_0$ of the current patterns $a_i$, $b_i$ by taking the breakdowns into seed patterns $a_0$, $b_0$ of the old patterns $a_1$, $b_1$ and replacing in these breakdowns the seed patterns $a_0$, $b_0$ with the breakdowns of the previous patterns $a_{(i-1)}$, $b_{(i-1)}$ stored in the previous patterns file. Thus with the signal example as described where the old patterns $a_1$, $b_1$ have for example the breakdowns:

$$a_1 = f(a_0, b_0) = a_0 \, b_0 \, a_0$$

$$b_1 = g(a_0, b_0) = b_0 \, b_0 \, b_0$$

and assuming that the branching construction is at the stage of determining the compositions of the intermediary patterns $a_i$, $b_i$, those of the previous patterns $a_{(i-1)}$, $b_{(i-1)}$ stored in the previous patterns file taking the forms:

$$a_{(i-1)} = f(a_0, b_0)$$

$$b_{(i-1)} = g(a_0, b_0)$$

the microprocessor 10 determines the compositions of the patterns $a_i$ and $b_i$ by applying the relations:

$$a_i = f(a_{i-1}, b_{i-1}) = f(a_0, b_0) g(a_0, b_0) f(a_0, b_0)$$

$$b_i = g(a_{i-1}, b_{i-1}) = g(a_0, b_0) g(a_0, b_0) g(a_0, b_0)$$

When producing the signal the microprocessor 10 reads sequentially in the latest current patterns file (which has become a definitive patterns file) the breakdown into seed patterns ($a_0$, $b_0$) of the pattern "$a_n$", replaces in this breakdown the seed patterns $a_0$, $b_0$ with the sequences of samples which define them (block 114) and applies the sequence of samples obtained in this way at a regular rate to the digital-to-analog converter 14 (see last step on FIG. 3 flowchart at block 115) which delivers the output signal of the generator and optionally comprises at the output a power interface for matching the characteristics of the delivered signal to those required by the application.

The programs controlling the microprocessor stored in the read-only memory 12 for managing the keyboard-display system 11 and the digital-to-analog converter 14 and the creation of the files and the manipulation of their content will not be described here as they form part of the current state of the art in microprocessors.

Only the current patterns file and the previous patterns file grow to any size during the iterations. With the example as described and construction halted after 13 successive applications of the recurrent pattern type composition laws, the previous patterns file contains at the end of determining the periodic configuration pattern approximately twice 1.6 Megabits and the current patterns file approximately twice 5 Megabits, which represents 13.2 Megabits or 1.7 Megabytes and is within the scope of standard microcomputers.

Some arrangements may be modified and some means may be replaced by equivalent means without departing from the scope of the invention.

Thus it is possible to memorize in the old patterns file not the patterns ($a_1$, $b_1$) resulting from the first application to the seed patterns ($a_0$, $b_0$) of the recurrent pattern type composition laws but intermediate patterns ($a_i$, $b_i$) resulting from multiple successive applications of the recurrent laws. At the cost of increasing the capacity of the old patterns file, this reduces the number of iterations necessary for the same number of applications of the recurrent pattern type composition laws and consequently increases the speed with which a periodic configuration pattern is created for a signal.

An increase in speed of this kind is advantageous in optical processing of information.

Furthermore, the sequences for defining the seed patterns $a_0$, $b_0$ may be reduced to a single sampling of the signal level or may comprise more than three of these, there optionally being more than two seed patterns and more than two recurrent pattern type composition laws.

We claim:

1. A periodic temporal signal generator for generating a periodic binary signal representing a binary sequence, said binary sequence having a periodic configuration pattern $a_n$ which comprises an arrangement of seed patterns and which is one of m pattern components of a term $U_n$ of a sequence of terms $U_0 U_1, \ldots U_n$, where m and n are integers and m is greater than 1, and where $U_0$ comprises an initial term of said sequence of terms and is formed by one of each of said seed patterns, said pattern components of said term $U_n$ being defined by application of m pattern composition laws to the pattern components of the preceding term $U_{n-1}$ of said sequence of terms, said generator comprising working memory means (13) for storing a definitive patterns file which contains a final arrangement of the seed patterns constituting said periodic configuration pattern $a_n$, and output means (14) coupled to said working memory means for supplying said periodic binary signal in accordance with the content of said definitive patterns file, said signal generator further comprising:

an old patterns file (13b) in said working memory means for storing breakdowns into said seed patterns of old pattern components resulting from at least one application to said seed patterns of said pattern composition laws;

a previous patterns file (13c) in said working memory means for storing breakdowns into said seed patterns of previous pattern components obtained during an iteration step immediately preceding the current iteration step, each of said previous pattern components corresponding to a respective one of said seed patterns in said old pattern components;

reading means coupled to said working memory means for reading said old pattern components from said old patterns file and said previous pattern components form said previous patterns file;

replacing means coupled to said reading means for replacing the seed patterns of said old pattern components with the seed pattern breakdown stored in said previous patterns file for the corresponding previous pattern component to thereby obtain seed pattern breakdowns of current pattern components and a current patterns file (13d) in said working memory coupled to said replacing means for storing said seed pattern breakdowns of said current components; and repeating means for repeatedly actuating both said reading means and said replacing means a given number of times until said definitive patterns are obtained.

2. A generator according to claim 1, wherein said old patterns file contains breakdowns into said seed patterns of the pattern components resulting from a first application of said pattern composition laws to said seed patterns.

3. A generator according to claim 1, wherein said reading, replacing and repeating means comprise a microprocessor (10).

4. A generator according to claim 1, wherein m=2 and said pattern composition laws are $$a_n = a_{n-1} b_{n-1} a_{n-1}$$

$$b_n = b_{n-1} b_{n-1} b_{n-1}.$$

* * * * *